(12) United States Patent
Saomoto et al.

(10) Patent No.: US 7,843,983 B2
(45) Date of Patent: Nov. 30, 2010

(54) SEMICONDUCTOR LASER ELEMENT AND MANUFACTURING METHOD THEREOF

(75) Inventors: Hitoshi Saomoto, Tottori (JP); Manabu Iwamoto, Tottori (JP)

(73) Assignees: Sanyo Electric Co., Ltd., Moriguchi-shi (JP); Tottori Sanyo Electric Co., Ltd., Tottori (JP)

( * ) Notice: Subject to any disclaimer, the term of this patent is extended or adjusted under 35 U.S.C. 154(b) by 62 days.

(21) Appl. No.: 10/592,943

(22) PCT Filed: Mar. 16, 2005

(86) PCT No.: PCT/JP2005/004699

§ 371 (c)(1),
(2), (4) Date: Sep. 15, 2006

(87) PCT Pub. No.: WO2005/091454

PCT Pub. Date: Sep. 29, 2005

(65) Prior Publication Data

US 2007/0195842 A1   Aug. 23, 2007

(30) Foreign Application Priority Data

Mar. 18, 2004 (JP) ............... 2004-077689
Mar. 19, 2004 (JP) ............... 2004-079543
Mar. 19, 2004 (JP) ............... 2004-079544

(51) Int. Cl.
*H01S 5/02* (2006.01)
*H01S 5/22* (2006.01)
*H01S 5/24* (2006.01)
*H01S 5/40* (2006.01)

(52) U.S. Cl. .............. 372/50.12; 372/36; 372/43.01; 372/44.01; 372/46.012

(58) Field of Classification Search .......... 372/43.01, 372/50.12, 36, 44.01, 46.012, 50.121, 50.122
See application file for complete search history.

(56) References Cited

U.S. PATENT DOCUMENTS 5,963,572 A   10/1999   Hiroyama et al.

(Continued)

FOREIGN PATENT DOCUMENTS

CA   2302791 A1   4/1999

(Continued)

OTHER PUBLICATIONS

International Search Report of PCT/JP2005/004699, date of mailing Jun. 21, 2005.
Korean Office Action dated Dec. 14, 2007, issued in corresponding Korean Application No. 10-2006-7018977.

*Primary Examiner*—Minsun Harvey
*Assistant Examiner*—Michael Carter
(74) *Attorney, Agent, or Firm*—Westerman, Hattori, Daniels & Adrian, LLP

(57) ABSTRACT

In an element wherein a plurality of ridges (16, 36) are arranged in parallel, supports (17, 37) are formed to sandwich each of the ridges (16, 36). More specifically, on an outer side of the ridge (16) in the element, the first support (17a) is formed, and on an inner side in the element, the second support (17b) is formed. On an outer side of the ridge (36) in the element, the first support (37a) is formed, and on an inner side in the element, the second support (37b) is formed. Thus, even when a resist is applied on an element surface and spin-coating is performed at the time of manufacturing the element, the resist on the inner side than the ridges (16, 36) in the element can be prevented from flowing into a groove between the ridges to a certain extent by means of the second supports (17b, 37b), and a resist film thickness on the inner sides of the ridges (16, 36) in the element can be prevented from being considerably small compared with that on the outer sides in the element.

4 Claims, 10 Drawing Sheets

U.S. PATENT DOCUMENTS

| | | | | |
|---|---|---|---|---|
| 6,075,800 A | * | 6/2000 | Spear | 372/36 |
| 6,199,561 B1 | * | 3/2001 | Mitsuhashi | 134/1.1 |
| 6,411,642 B1 | * | 6/2002 | Mazed | 372/103 |
| 6,618,420 B1 | * | 9/2003 | Gen-Ei et al. | 372/50.1 |
| 2002/0024985 A1 | * | 2/2002 | Takeuchi et al. | 372/46 |
| 2002/0028390 A1 | | 3/2002 | Mazed | |
| 2003/0231685 A1 | * | 12/2003 | Nakamura et al. | 372/46 |

FOREIGN PATENT DOCUMENTS

| | | |
|---|---|---|
| CA | 2304795 A1 | 4/1999 |
| EP | 1021749 A1 | 7/2000 |
| JP | 11-145558 A | 5/1999 |
| JP | 2001-230498 A | 8/2001 |
| JP | 2001-517866 A | 10/2001 |

* cited by examiner

Fig.7
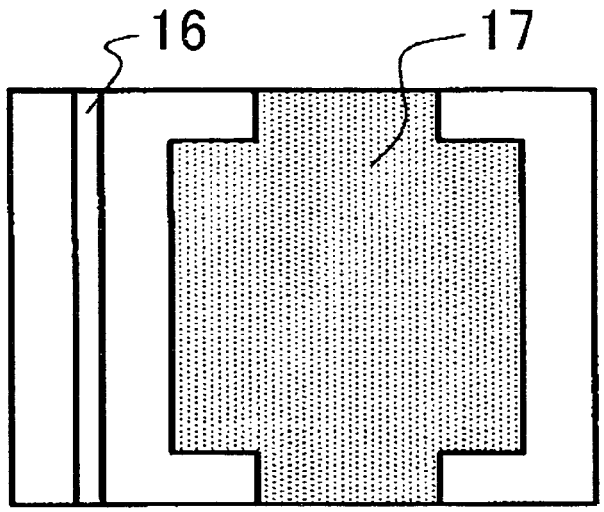
Fig.7A
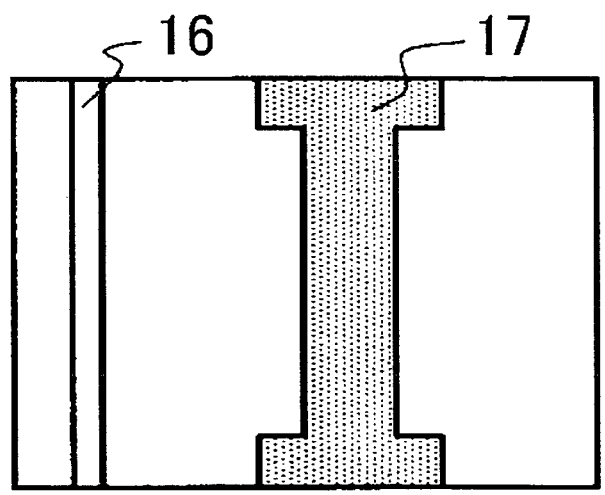
Fig.7B
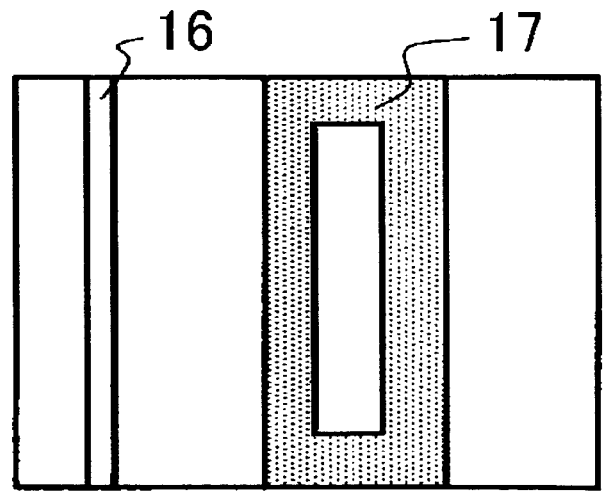
Fig.7C

Fig.8
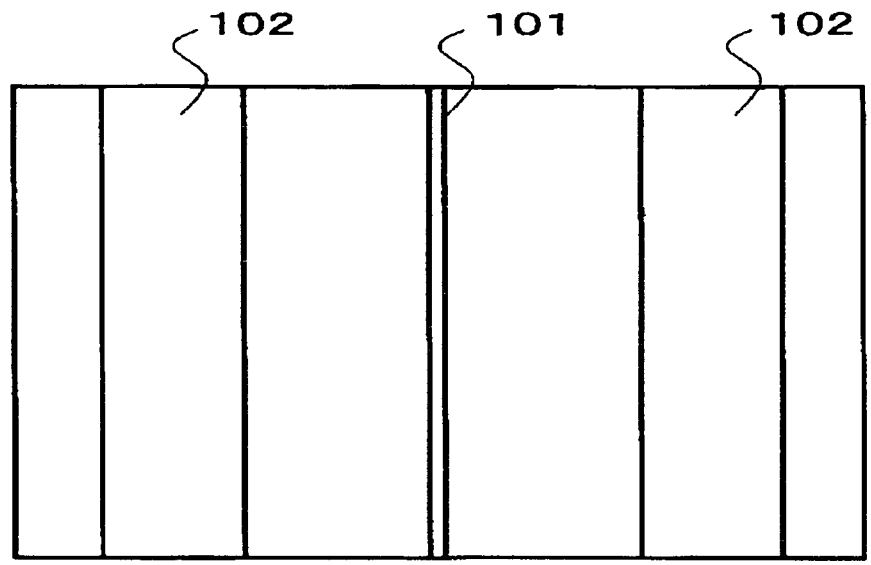
Fig.8A
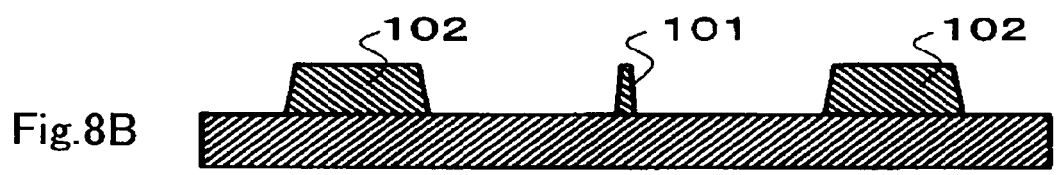
Fig.8B
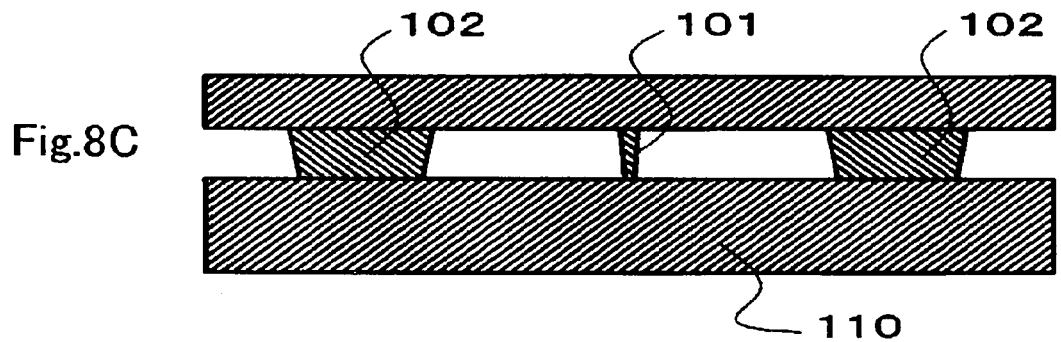
Fig.8C

Fig.10
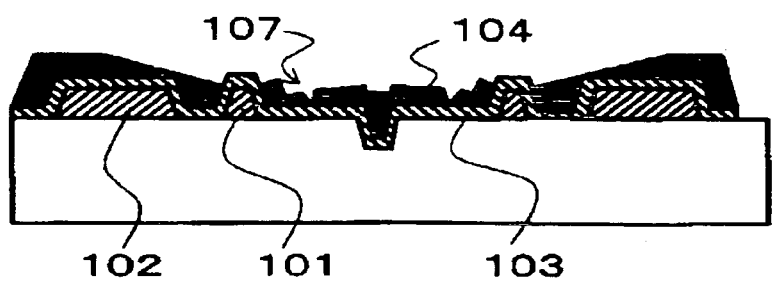
Fig.10A
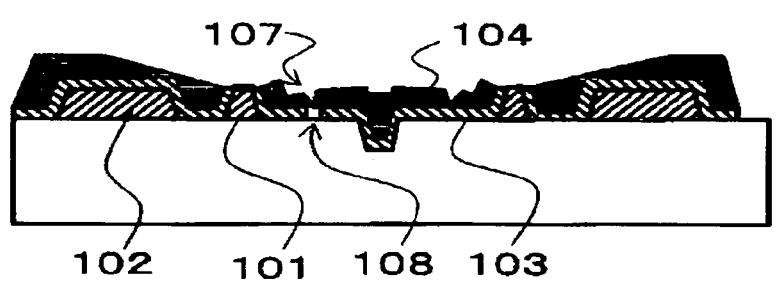
Fig.10B
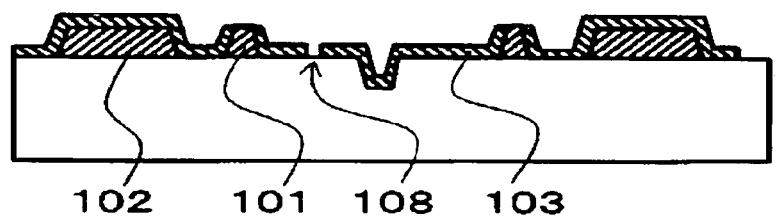
Fig.10C
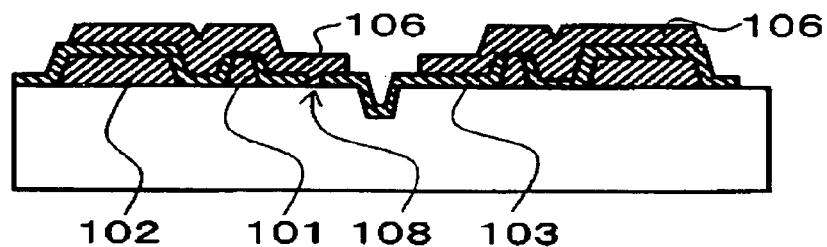
Fig.10D

SEMICONDUCTOR LASER ELEMENT AND MANUFACTURING METHOD THEREOF

FIELD OF THE INVENTION

The present invention relates to a semiconductor laser element including a plurality of stripe ridges and a manufacturing method thereof.

RELATED ART

Various ridge-stripe semiconductor laser elements (see Patent Document 1, for example) have been developed. FIG. 8A is a plan view of a related art semiconductor laser element. FIG. 8B is a sectional view of the above-mentioned semiconductor laser element. The semiconductor laser element includes on a substrate an n-type cladding layer, an active layer, a p-type cladding layer, an etching stopper layer, a p-type cladding layer, and a p-type contact layer deposited in this order. By etching the p-type cladding and contact layers, provides a ridge 101 on the surface of the element and supports 102, 102 on both sides of the ridge 101 with a predetermined space therebetween. For simplifying the description, an n-type block layer, a p-type electrode, and an n-type electrode are not shown.

Supposing that the above-mentioned semiconductor laser element is 300 μm wide, the distance from the center of the ridge 101 to the ends of the supports 102, 102 on their sides facing the ridge 101 (hereinafter referred to as the "ridge-support distance") is set at 70 μm, for example. The width of the supports 102, 102 (i.e., the length of the supports 102, 102 in the chip width direction) is 50 μm each, totaling 100 μm. Accordingly, the ratio of the width of the supports relative to the entire width of the chip accounts for about 33% (100/300× 100).

The thus structured semiconductor laser element is mounted on a submount 110 at its side having the ridge 101 and the supports 102, 102 on the substrate as shown in FIG. 8C. This semiconductor laser element is held by a holder (not shown) with the submount 110 therebetween (i.e., junction-down mounting).

There have been also developed various twin-stripe semiconductor laser elements including two ridges to emit two laser beams of different wavelengths or the same wavelength (see Patent Document 2, for example). This type of semiconductor laser elements is manufactured as follows, for example. While the following description is about a method for manufacturing a semiconductor laser element to which junction-down mounting is applied so as to make a holder hold the semiconductor laser element with a submount therebetween, the description uses like numerals for like elements included in the semiconductor laser element shown in FIGS. 8A to 8C.

On a substrate, an n-type buffer layer, an n-type cladding layer, an active layer, a first p-type cladding layer, an etching stopper layer, a second p-type cladding layer, and a p-type contact layer are provided. By dry-etching and wet-etching the second p-type cladding layer and the p-type contact layer, provided are two ridges 101, 101 and a pair of supports 102, 102 on outer sides of the ridges 101, 101 (see FIG. 9A). For simplifying the description, the n-type block layer, p-type electrode, and n-type electrode are not shown.

Provided next on the element surface is an n-type block layer 103 (see FIG. 9B). A resist (hereinafter referred to as the "resist") 104 is then applied thereto (see FIG. 9C). To remove the resist 104 on the top surfaces of the ridges 101, 101, the resist 104 is exposed to light with a light shielding part 105 serving as a mask for shielding parts other than the top surfaces from light (see FIG. 9D). As a result, the resist 104 on and around the top surfaces of the ridges 101, 101 is removed (see FIG. 9E).

The n-type block layer 103 on the top surfaces of the ridges 101, 101 is etched and removed (see FIG. 9F). The resist 104 is then peeled (see FIG. 9G) to make a p-type electrode 106 that is conductive to the top surfaces of the ridges 101, 101 on the element surface (see FIG. 9H). Meanwhile, an n-type electrode (not shown) is provided on the back surface of the substrate, namely, on the side opposite to the side having the p-type electrode 106.

[Patent Document 1]

Japanese Patent No. 3348024

[Patent Document 2]

JP-2003-69154-A

DISCLOSURE OF THE INVENTION

Problems to be Solved

Application of the resist 104 as shown in FIG. 9C is generally performed by spin coating. This method involves dropping the resist 104 on the element surface, then rotating the wafer to laterally spread the resist 104, and irradiating the resist with light to harden it.

This method however has the following problem. Since each ridge 101 is provided with the support 102 on one side (i.e., on the outer sides in the element in FIGS. 9A through 9H), the thickness of the resist 104 formed by spin coating is a little inconsistent between the inner side having no support 102 and the outer side having the support 102 of the ridge 101 in practice, thereby bringing an adverse effect to characteristics of the element. The problem will be further described with reference to FIGS. 10A through 10D.

FIG. 10A shows the resist 104 that is made thinner on the inner side of each ridge 101 in the element and thicker on the outer side in the element in the step shown in FIG. 9E. Applying the resist 104 by spin coating to the element surface causes the resist to flow into a groove between the ridges shortly after the application. This flow can make the thickness of the resist 104 on the inner side in the element too small. The resist 104 may have a hole 107 in an extreme case.

Consequently as shown in FIG. 10B, etching of the n-type block layer 103 shown in FIG. 9F removes not only the n-type block layer 103 on the top surface of the ridge 101, but also the n-type block layer 103 that is in an underlying layer inappropriately via the hole 107 in the resist 104 on the inner side of the ridge 101 in the element, which leaves a space 108. If the resist 104 is peeled in this state (see FIG. 10C) and the p-type electrode 106 is provided to cover the ridge 101, the p-type electrode 106 flows into the space 108 in the n-type block layer 103 (see FIG. 10D). This structural failure can deteriorate the optical output and other characteristics of the element.

Moreover, the operational current, operational voltage, wavelength, and other characteristics of the semiconductor laser element required for achieving a fixed optical output, for example, change in line with ambient temperature. The characteristics relative to ambient temperature are hereinafter referred to as "temperature characteristics". Changes in the characteristics relative to ambient temperature are referred to as a "reduction in the temperature characteristics". Since a reduction in the temperature characteristics can lower the reliability of the element, it is necessary to cut the reduction as much as possible.

As regards the operational current among the characteristics of the semiconductor laser element, it increases as the temperature of the active layer emitting laser light increases. This is because the efficiency of converting current into light (conversion efficiency) decreases as the temperature of the active layer increases. To enhance the reliability of the element, it is necessary to let the heat generated in and around the active layer out to parts other than the active layer (or to a portion other than the element), thereby preventing a temperature rise in the active layer and an increase in the operational current.

Accordingly, the semiconductor laser element to which junction-down mounting is applied is provided with the supports 102, 102 on the both sides of the ridge as shown in FIGS. 8A through 8C, for example, to transfer the heat generated in the active layer to the submount 110 through the ridge 101 and the supports 102, 102.

The above-described related art semiconductor laser element, however, has a comparatively long ridge-support distance of 70 μm. Moreover, the ratio of the width of the supports relative to the entire width of the chip is about 33% (100/300×100), which is comparatively small. Therefore, in practice it is hard for the heat generated in the active layer underlying the ridge 101 to be transferred to the submount 110 through the supports 102, 102. The heat release from the element is not enough to surely prevent a temperature rise in the active layer. As a result, the operational current increases, which means that the temperature characteristics worsen, and thereby the reliability of the element fails to surely enhance.

Meanwhile, it is difficult to etch between the ridge 101 and the supports 102, 102 with a smaller ridge-support distance. It is also unsuitable to increase the ratio of the width of the supports relative to the entire width of the chip, which decreases a region for visual monitoring of the progress of etching of the ridge 101 and the supports 102, 102 until the etching stopper layer. This decrease makes it difficult to visually monitor the progress of etching and thus to manufacture the element.

The above problem is more significant for a twin-stripe semiconductor laser element provided with the support 102 only on one side of each ridge 101 (on the outer sides in the element in FIGS. 9A through 9H).

The present invention addresses the above-described problem and its purpose is to provide a twin-stripe semiconductor laser element and a manufacturing method thereof that is capable of (1) when manufacturing the element including a plurality of ridges, making the thickness of a resist applied to both sides of each ridge even and thus eliminating manufacturing failures, (2) preventing difficulties in manufacturing the element, and (3) surely enhancing heat release performance of the element to ensure an increase in the temperature characteristics of the element, and thereby enhancing the temperature characteristics and reliability of the element.

Means to Solve the Problems

A semiconductor laser element of the present invention includes a plurality of ridges arranged in parallel with each other inside a pair of first supports protecting the ridges, and a second support provided between the plurality of ridges and protecting the ridges.

The above-described structure includes a pair of supports (first supports) on the outer sides of the plurality of ridges arranged in parallel with each other and also includes another support (second support) between the plurality of ridges. Even if a resist is applied by spin coating to the element surface in the element manufacturing process, the second support prevents the resist on the inner side of each ridge in the element from flowing in between the ridges to a certain extent. Accordingly, it is possible to prevent the resist film thickness on the inner sides of the ridges in the element from being considerably small compared with that on the outer sides in the element. Consequently, this structure can prevent etching from reaching a layer underlying the resist on the inner sides in the element (the block layer except for the ridge top) in the following etching step (e.g., etching of the ridge top of the block layer provided to cover the ridge), making it possible to prevent element structural failures and characteristic deterioration.

In particular, if the above second support is provided corresponding to each ridge, the supports (first and second supports) are provided to both sides of each ridge, whereby each ridge is sandwiched between the first and second supports. It is therefore possible to surely prevent the resist film thickness on the inner side of each ridge in the element from being smaller than that on the outer side in the element and surely prevent element characteristic deterioration because of the above-mentioned structural failures.

If the element is provided with a monitor region at each of its outermost edges to monitor the progress of etching, providing the above second support makes it possible to monitor the progress thereafter with this monitor region at each outermost edge of the element even if the progress cannot be monitored with an inner region of the element. Consequently, it is possible to prevent structural failures of the element attributed to poor etching.

Furthermore, if the monitor region also serves as an isolation groove to isolate the element, the isolation groove has both element isolation and etching monitor functions. In other words, it is possible to substitute the isolation groove for the monitor region.

If the distance from the center of the ridge to the ends of the supports on their sides facing the ridge (i.e., the ridge-support distance) ranges from more than 20 μm to less than 50 μm, this distance less than 50 μm is sufficiently shorter than 70 μm as in related art examples. Therefore, the heat generated in the active layer underlying the ridge is surely transferred not only to the ridge but also to the supports. This structure makes it possible to surely release the heat to the outside (e.g., to a holder through a submount for junction-down mounting) through the ridge and supports, thereby surely enhancing heat release performance of the element. As a result, it is possible to surely prevent a temperature rise in the active layer and surely enhance the temperature characteristics of the element (e.g., ensuring a reduction in the operational current to achieve a fixed optical output), thereby surely enhancing the reliability of the element. Since the ridge-support distance is set more than 20 μm, it is possible to surely prevent difficulties in manufacturing the element without adversely affecting etching between the ridge and supports.

The ridge-support distance preferably ranges from more than 20 μm to 40 μm or less, and more preferably ranges from more than 20 μm to 33 μm or less. By lowering the upper limit of the ridge-support distance, it is possible to further enhance the heat release performance and thus the reliability of the element. In particular, when the ridge-support distance ranges from 30 μm to 33 μm inclusive, it is possible to ensure the above-described effects and increase a region to be etched between the ridge and supports, making it easy to etch the region.

If the ratio Rw of the total width Wss of the supports relative to the entire width Wc of the chip of the semiconductor laser element is set within a range from more than 33% to less than 52%, the area of the supports surely increases compared with related art examples. Here, the area of the supports means a plane area on the support surface in the element when seen from above. This structure makes it possible to surely enhance the heat release effect of the supports; that is, effects of releasing the heat generated in the active layer to the outside. As a result, it is possible to surely prevent a temperature rise in the active layer and surely enhance the temperature characteristics of the element (e.g., ensuring a reduction in the operational current to achieve a fixed optical output), thereby surely enhancing the reliability of the element.

Since the ratio of the width of the supports is less than 52% relative to the entire width of the chip, it is possible to ensure a monitor region for monitoring the progress of etching until the etching stopper layer while etching the ridge and supports. Consequently, it is possible to surely prevent difficulties in manufacturing the element without adversely affecting etching of the ridge and supports.

With a fixed length of the element in the longitudinal direction of the ridge, the ratio of the width of the supports relative to the entire width of the chip equals the ratio of the area of the supports relative to the entire area of the element (the plain area on the element surface when seen from above). Therefore, if the ratio of the area of the supports relative to the entire area of the element is set within a range from more than 33% to less than 52%, the above-described effects are available as well. In this case, the planar shape of the supports is not limited to being rectangular, making it possible to provide supports in various planar shapes and thus increase element variations.

The ratio of the width of the supports preferably ranges from more than 44% to less than 50% relative to the entire width of the element chip. When the ratio of the width of the supports relative to the entire width of the element chip exceeds 44%, the increased area of the supports can enhance the heat release effect of the supports. It is therefore possible to surely prevent a temperature rise in the active layer and surely enhance the temperature characteristics of the elements, thereby surely enhancing the reliability of the element.

When the ratio of the width of the supports relative to the entire width of the element chip is set at less than 50%, it is possible to ensure a broader monitor region. Accordingly, it is possible to more surely prevent etching failures in the ridge and supports and difficulties in manufacturing the element.

In the same manner, when the ratio of the area of the supports relative to the entire area of the element ranges from more than 44% to less than 50%, the above-described effects are available as well. Furthermore, it is possible to provide supports in various planar shapes.

A method for manufacturing a semiconductor laser element of the present invention includes: arranging a plurality of ridges in parallel with each other on a surface of the element and providing each of the ridges with a plurality of supports to sandwich each of the ridges, providing a block layer on surfaces of the ridges and the supports, applying a protective film by spin coating to a surface of the block layer, removing the protective film covering a top surface of the ridges, removing the block layer covering the top surface of the ridges with the protective film serving as a mask, and providing an electrode layer covering the ridges.

This manufacturing method provides the supports sandwiching each of the plurality of ridges arranged in parallel with each other. In other words, the supports are provided on both sides, namely, the inner and outer sides, of each ridge in the element. The block layer is provided to the surface of each ridge and support in this state, and then the protective film (e.g., a resist) is applied by spin coating to the surface of the block layer. The supports on the inner sides of the ridges in the element prevent each resist on the inner sides of the ridges in the element from flowing into a groove between the ridges to a certain extent. Accordingly, it is possible to prevent the resist film thickness on the inner sides of the ridges in the element from being considerably small compared with that on the outer sides in the element.

When removing the resist covering the top surfaces of the ridges and removing the block layer covering the top surfaces of the ridges with the resist serving as a mask thereafter, it is possible to prevent the block layer underlying the resist on the inner sides of the ridges in the element from being removed and prevent a electrode layer provided thereafter to cover the ridges from flowing in the block layer other than the ridges. Consequently, it is possible to prevent element structural failures and thus characteristic deterioration.

BRIEF DESCRIPTION OF THE DRAWINGS

FIGS. 7A through 7C are plain views showing other structure examples of the supports.

FIG. 8A is a plan view of a related art semiconductor laser element. FIG. 8B is a sectional view schematically showing the structure of the semiconductor laser element. FIG. 8C is a sectional view showing the above-mentioned semiconductor laser element junction-down mounted on a submount.

FIGS. 10A through 10D are sectional views showing part of the manufacturing steps shown in FIGS. 9E and 9F in greater detail.

REFERENCE NUMERALS

| | |
|---|---|
| 5 | Isolation groove (Monitor region) |
| 16 | Ridge |
| 17 | Support |
| 17a | First support |
| 17b | Second support |
| 18 | Block layer |
| 19 | P-type electrode (Electrode layer) |
| 36 | Ridge |
| 37 | Support |
| 37a | First support |
| 37b | Second support |

-continued

| 38 | Block layer |
| 39 | P-type electrode (Electrode layer) |
| 51 | Block layer |
| 52 | Resist (Protective film) |

DESCRIPTION OF THE PREFERRED EMBODIMENTS

An embodiment of the present invention will now be described with reference to the accompanying drawings.

Figure 1:
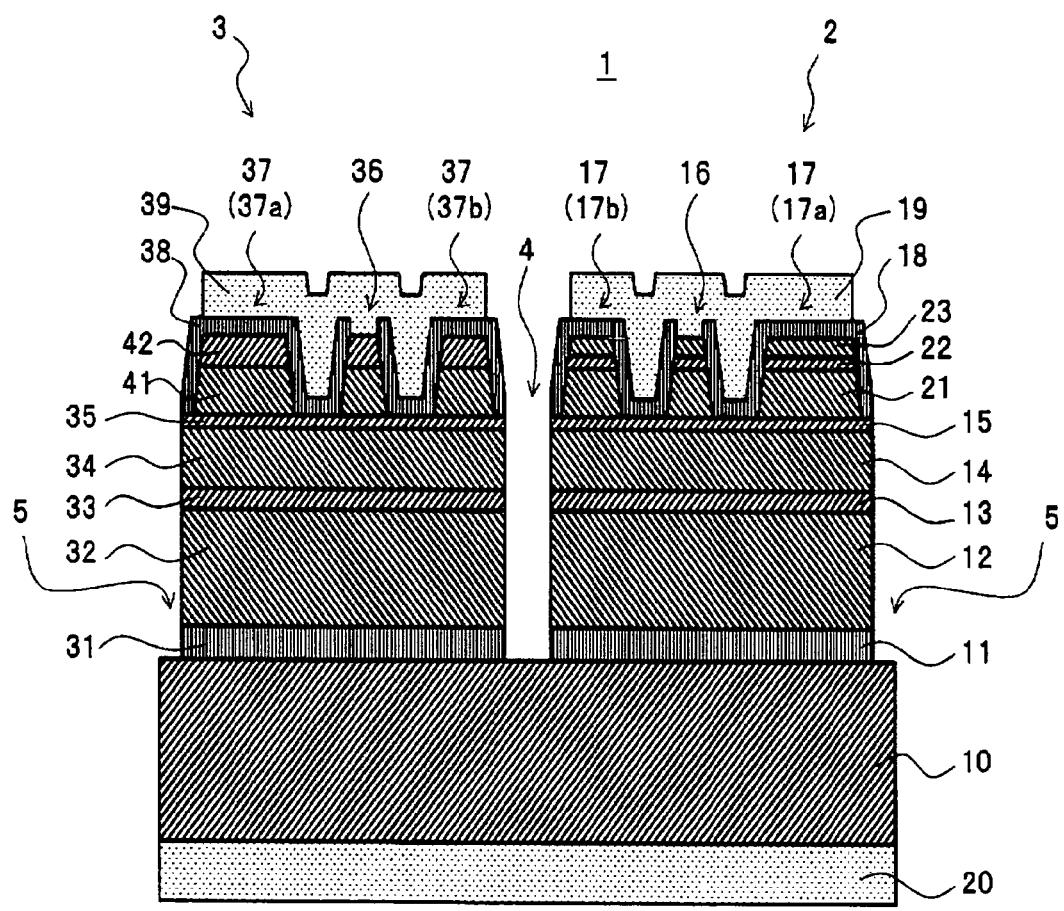
FIG. 1 is a sectional view schematically showing the structure of a semiconductor laser element according to one embodiment of the present invention.

FIG. 1 is a sectional view schematically showing the structure of a semiconductor laser element (hereinafter simply referred to as the "element") according to the present invention. This element 1 is a twin-stripe element capable of emitting red laser light and infrared laser light that have different wavelengths. The element includes on an n-type (first conductivity type) GaAs substrate 10 a red laser light emitting part 2 emitting red laser light and an infrared laser light emitting part 3 emitting infrared laser light.

Also provided on the substrate 10 between the red laser light emitting part 2 and the infrared laser light emitting part 3 is an isolation groove 4 to prevent a short circuit. Each outermost edge of the element is provided with an isolation groove 5. The isolation groove 5 separates adjacent elements on a single wafer and also serves as a monitor region to monitor the progress of etching in a manufacturing process that will be described later.

The red laser light emitting part 2 includes on the substrate 10 an n-type GaInP buffer layer 11, an n-type AlGaInP cladding layer 12, a GaInP/AlGaInP active layer 13 emitting red laser light, a p-type (second conductivity type) AlGaInP cladding layer 14, and a p-type GaInP etching stopper layer 15 deposited in this order.

Provided on the etching stopper layer 15 is a stripe ridge 16. On both sides of the ridge 16, supports 17 are provided with a predetermined space therebetween. The supports 17 are supporting parts to mount the element stably to a submount 45 (see FIG. 2) that will be explained later, thereby protecting the ridge 16.

The supports 17 include a first support 17a located on the outer side of the ridge 16 in the element and a second support 17b located on the inner side in the element. Provided on the surface except for the top surface of the ridge 16 is an n-type AlInP block layer 18. Deposited on the top surface of the ridge 16 and the block layer 18 is a p-type electrode 19. Meanwhile, an n-type electrode 20 is provided on the back surface of the substrate 10. This electrode is commonly used by the infrared laser light emitting part 3.

Each of the above-mentioned ridge 16 and the supports 17 includes a p-type AlGaInP cladding layer 21, a p-type GaInP contact layer 22, and a p-type GaAs contact layer 23 deposited in this order.

The infrared laser light emitting part 3 includes on the substrate 10 an n-type AlGaAs buffer layer 31, an n-type AlGaAs cladding layer 32, an AlGaAs/AlGaAs active layer 33 emitting infrared laser light, a p-type AlGaAs cladding layer 34, and a p-type AlGaAs etching stopper layer 35 deposited in this order.

Provided on the etching stopper layer 35 is a stripe ridge 36. On both sides of the ridge 36, supports 37 are provided with a predetermined space therebetween. The supports 37 are supporting parts to mount the element stably to the submount 45 (see FIG. 2) that will be explained later, and thereby protecting the ridge 36. In other words, the supports 37 function so as to prevent the ridge 36 from folding due to the stress imposed during the processing of the element. The supports 37 also effectively function as a heat release member.

The supports 37 include a first support 37a located on the outer side of the ridge 36 in the element and a second support 37b located on the inner side in the element. Provided on the surface except for the top surface of the ridge 36 is an n-type AlGaAs block layer 38. Deposited on the top surface of the ridge 36 and the block layer 38 is a p-type electrode 39.

Each of the above-mentioned ridge 36 and the supports 37 include a p-type AlGaAs cladding layer 41 and a p-type GaAs contact layer 42 deposited in this order.

Figure 2:
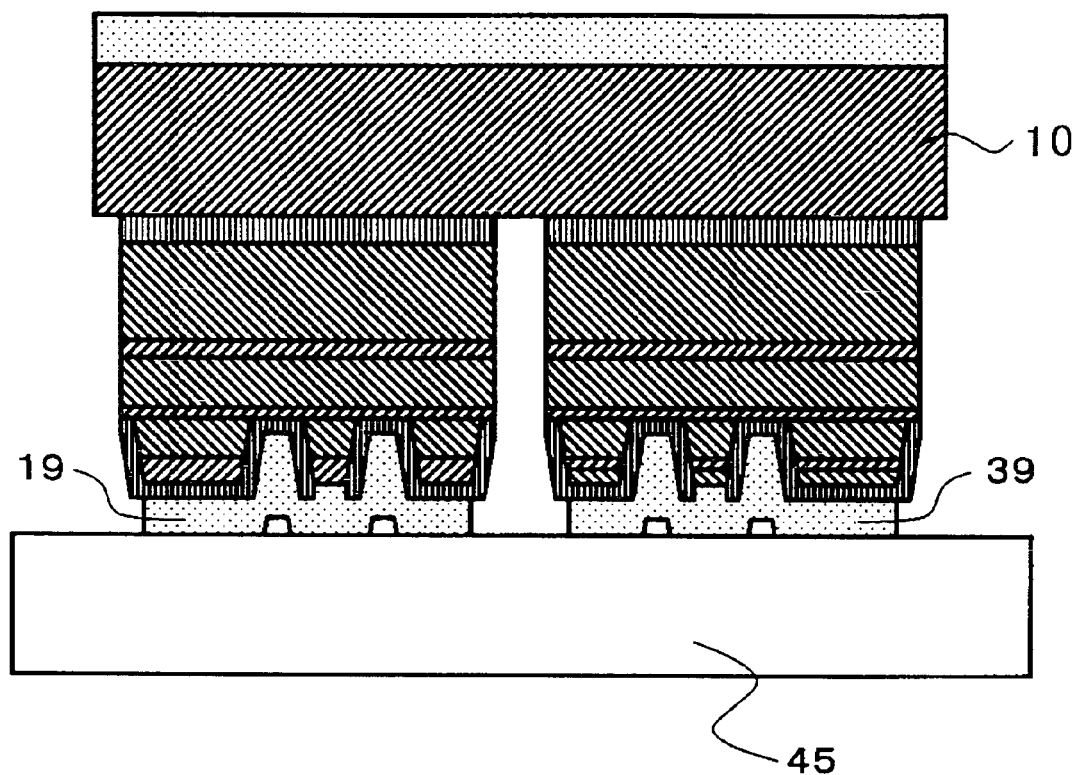
FIG. 2 is a sectional view showing the semiconductor laser element that is junction-down mounted on a submount.

The thus-structured element is mounted on the submount 45 at its side having the p-type electrodes 19 and 39 on the substrate 10 as shown in FIG. 2. The element is held by a holder (not shown) with the submount 45 therebetween (i.e., junction-down mounting).

The element according to the present embodiment includes the plurality of ridges 36 and 16 in the inner sides of the pair of first supports 37a and 17a and also includes the second supports 37b and 17b between the plurality of ridges 36 and 16. In the present embodiment in particular, the second supports 37b and 17b are provided corresponding to the ridges 36 and 16, respectively. Consequently, the ridge 36 is sandwiched by the first support 37a and the second support 37b each with a predetermined space therebetween. The ridge 16 is sandwiched by the first support 17a and the second support 17b each with a predetermined space therebetween.

Also in the present embodiment, for example, the element is 300 μm wide and each of the ridges 16 and 36 is 2 μm wide. The distance between the ridges 16 and 36 is 110 μm, while the distance between each of the centers of the ridges 16 and 36 and the center of the isolation groove 4 is 55 μm, for example. The distance from the center of the ridge 16 to each end of the supports 17 (i.e., the first support 17a and the second support 17b) on their sides facing the ridge 16 and the distance from the center of the ridge 36 to each end of the supports 37 (i.e., the first support 37a and the second support 37b) on their sides facing the ridge 36 are 20 μm, for example. This means that the first support 17a and the second support 17b are symmetrical relative to ridge 16, while the first support 37a and the second support 37b are symmetrical relative to the ridge 36.

A method for manufacturing the above-described element will now be described with reference to FIGS. 1 and 3A through 3H.

On the substrate 10, the buffer layers 11 and 31, the n-type cladding layers 12 and 32, the active layers 13 and 33, the p-type cladding layers 14 and 34, the etching stopper layers 15 and 35, the p-type cladding layers 21 and 41, and the contact layers 22, 23, and 42 are multi-layered to form the red laser light emitting part 2 and the infrared laser light emitting part 3. By dry-etching and wet-etching the p-type cladding layers 21 and 41 and the contact layers 22, 23, and 42, provide the two ridges 16 and 36, the first supports 17a and 37a on the outer sides of the ridges 16 and 36, respectively, and the second supports 17b and 37b on the inner sides of the ridges 16 and 36, respectively (see FIG. 3A).

Provided next on the element surface is a block layer 51 to be the block layers 18 and 38 in a later step (see FIG. 3B). A resist 52 serving as a protection film (hereinafter simply referred to as the "resist") is then applied by spin coating thereon (see FIG. 3C). Subsequently, to remove the resist 52 on the top surfaces of the ridges 16 and 36, the resist 52 is exposed to light with a light shielding part 53 serving as a mask for shielding parts other than the top surfaces from light (see FIG. 3D). Accordingly, the resist 52 on and around the top surfaces of the ridges 16 and 36 is removed (see FIG. 3E).

Figure 3:
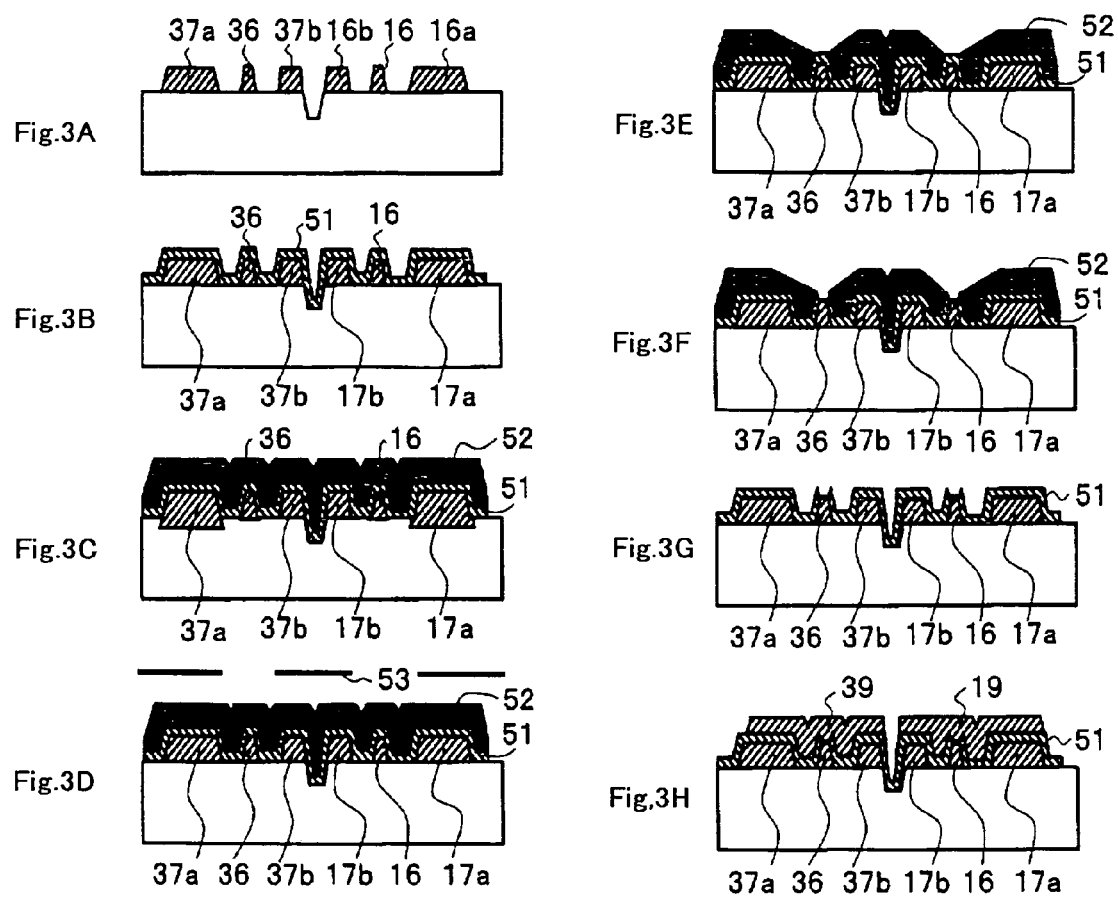
FIGS. 3A through 3H are sectional views showing manufacturing steps of the semiconductor laser element shown in FIG. 1.

The block layer 51 on the top surfaces of the ridges 16 and 36 is etched and removed (see FIG. 3F). The resist 52 is then peeled (see-FIG. 3G) to provide the p-type electrodes 19 and 39, which are conductive to the top surfaces of the ridges 16 and 36, on the element surface (see FIG. 3H). Meanwhile, the n-type electrode 20 (see FIG. 1) is provided on the back surface of the substrate, namely, on the side opposite to the side having the p-type electrodes 19 and 39. Subsequently, adjacent elements are separated into individual elements with the isolation groove 5.

In the above-described manufacturing process, the thickness of the resist 52 on both sides of the ridges 16 and 36 with the second supports 17b and 37b as in the present invention and without the second supports as in related art examples were measured. As regards a total of 4 elements including three adjacent elements A, B, and C on a central part of a wafer and another element D, the following was measured with a scanning electron microscope (SEM): (1) the film thickness of a resist a on the top surfaces of their ridges, (2) the film thickness of a resist b on the outer sides of the ridges in the elements, and (3) the film thickness of a resist c on the inner sides of the ridges in the elements, each measured in micrometers. Table 1 shows the measurement results.

turing process. Accordingly, it is possible to prevent the resist film thickness on the inner sides of the ridges 16 and 36 in the element from being considerably small compared with that on the outer sides in the element.

Consequently, when removing the resist 52 covering the top surfaces of the ridges and removing the block layer 51 covering the top surfaces of the ridges with the resist 52 serving as a mask thereafter, it is possible to prevent the block layer 51 underlying the resist 52 on the inner sides of the ridges 16 and 36 in the element from being removed as in the related art and prevent the electrode layer (the p-type electrodes 19 and 39 in the present embodiment) provided thereafter to cover the ridges 16 and 36 from flowing in the block layer 51 other than the ridges 16 and 36. Consequently, it is possible to prevent element structural failures and thus characteristic deterioration.

By providing not only a single second support between the ridges 16 and 36 but also the second supports 17b and 37b corresponding to the ridges 16 and 36, respectively, as in the present embodiment, the second support 17b for the ridge 16 and the second support 37b for the ridge 36 prevent the resist 52 from flowing from the inner sides to the outer sides in the element. It is therefore possible to surely prevent the resist film thickness on the inner sides of the ridges 16 and 36 in the element from being considerably small compared with that

TABLE 1

| | | element | | | | | film thickness difference between a | proportion of film thickness between a |
| | resist | A | B | C | D | average | and c | and c |
| --- | --- | --- | --- | --- | --- | --- | --- | --- |
| red laser light | a | 0.78 | 0.97 | 0.73 | 0.78 | 0.82 (0.78) | | 2.21 (2.06) |
| | b | 1.80 | 1.80 | 1.76 | 1.83 | 1.80 (1.61) | 0.09 (0.15) | |
| | c | 1.90 | 1.90 | 1.85 | 1.90 | 1.89 (1.76) | | |
| infrared laser light | a | 1.04 | 1.11 | 1.04 | 1.09 | 1.07 (0.95) | | 1.66 (1.69) |
| | b | 1.78 | 1.78 | 1.78 | 1.76 | 1.78 (1.61) | 0.07 (0.10) | |
| | c | 1.80 | 1.85 | 1.85 | 1.88 | 1.85 (1.71) | | | unit [um]
Values without second support are shown in parentheses

As shown in Table 1, the film thickness difference between the resists b and c located on the both sides of each ridge included in the red laser light emitting part 2 was reduced to 0.09 μm from 0.15 μm thanks to the second support 17b, whereby the resist thickness on the both sides of each ridge was more consistent. The decrease of 0.06 μm accounts for 40% of the original 0.15 μm, which means a 40% decrease in the inconsistency of the resist film thickness.

The film thickness difference in the infrared laser light emitting part 3 was reduced to 0.07 μm from 0.10 μm thanks to the second support 37b, whereby the resist thickness on the both sides of the ridge was more consistent. The decrease of 0.03 μm accounts for 30% of the original 0.10 μm, which means a 30% decrease in the inconsistency of the resist film thickness.

As described above, the element according to the present embodiment includes a plurality of ridges 16 and 36 arranged in parallel with each other between the pair of first supports, 17a and 37a and also includes second supports 17b and 37b between the plurality of ridges 16 and 36. The second supports 17b and 37b prevent the resist 52 on the inner sides of the ridges 16 and 36 in the element from flowing in between the ridges to a certain extent even if the resist 52 is applied by spin coating to the element surface in the element manufacon the outer sides in the element. Consequently, the above-mentioned effects of the present embodiment can be surely achieved.

Since the supports 17 and 37 are provided to the both sides of the ridges 16 and 36, there is the effect of being able to reduce assembly failure compared with when the supports 17 and 37 are provided to one side alone. In other words, the element provided with the supports 17 and 37 on one side alone of the ridges 16 and 36 receives a load only on the supports 17 and 37 on one side when the element is mounted on a holder with the submount 45 therebetween. The element structure according to the present embodiment, however, can distribute the load during the assembly of the supports 17 and 37 on the both sides and thus can provide an element with higher reliability.

By providing one element with not only the first supports 17a and 37a but also the second supports 17b and 37b, when the element is mounted on a holder with the submount 45 therebetween, it is possible to transfer the heat generated due to laser output from the active layers 13 and 33 to the submount 45 side through not only the first supports 17a and 37a but also the second supports 17b and 37b. In other words, an element provided with the second supports 17b and 37b has higher heat release performance than an element without the second supports 17b and 37b. Consequently, it is possible to prevent a temperature rise in the active layers 13 and 33 and reduce the operational current flowing between the electrodes to achieve a fixed optical output of 40 mW, for example, at 70 degrees Celsius. This enhancement in temperature characteristics enhances the reliability of the element.

Figure 4:
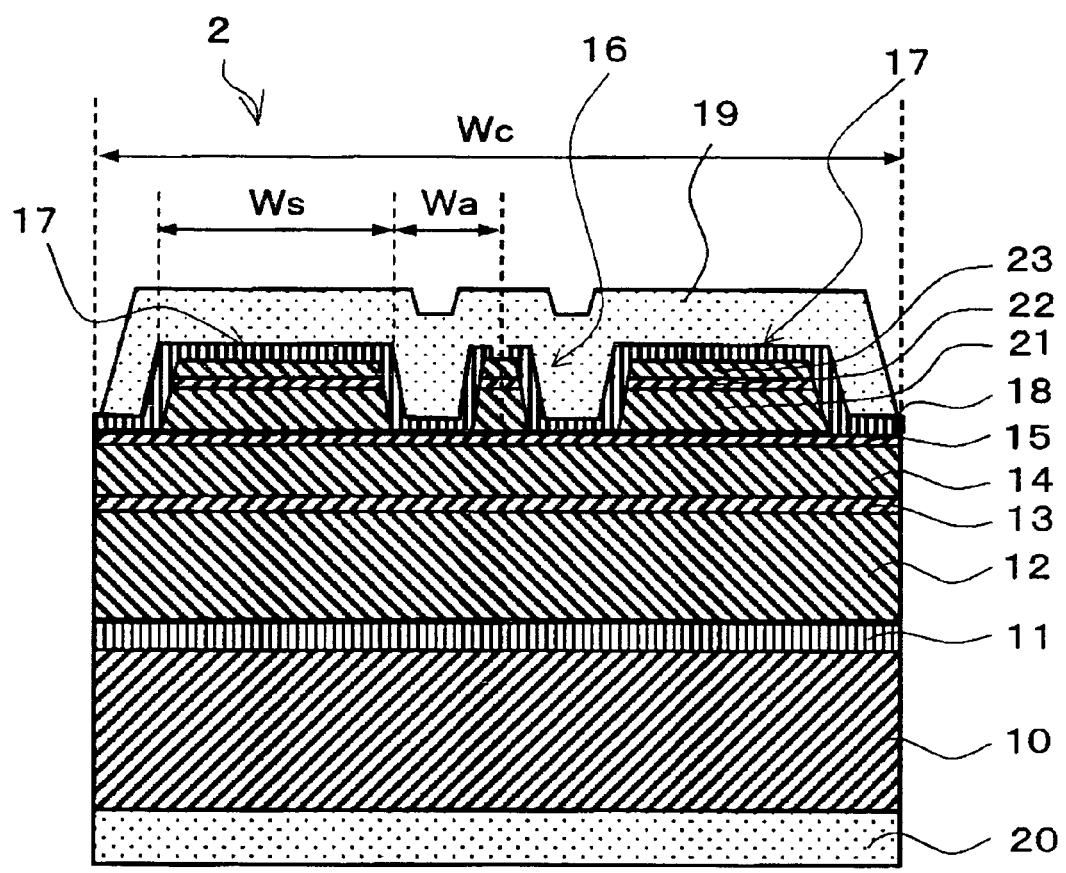
FIG. 4 is a sectional view schematically showing the structure of a red laser emitting part on one side of the twin-stripe semiconductor laser element shown in FIG. 1 and provided as a single semiconductor laser element.

To enhance the heat release performance and temperature characteristics of the element, the distance from the center of the ridge 16 to the ends of the supports 17, 17 on their sides facing the ridge 16 (hereinafter referred to as the "ridge-support distance") is set at Wa based on the following experimental results of the semiconductor laser element, which will now be described with reference to FIG. 4. FIG. 4 is a sectional view schematically showing the structure of the red laser emitting part 2 on one side of the twin-stripe semiconductor laser element shown in FIG. 1 and provided as a single semiconductor laser element. The like numerals indicate like elements in the drawings, and the description of the same structure as in FIG. 1 will be omitted here.

Figure 5:
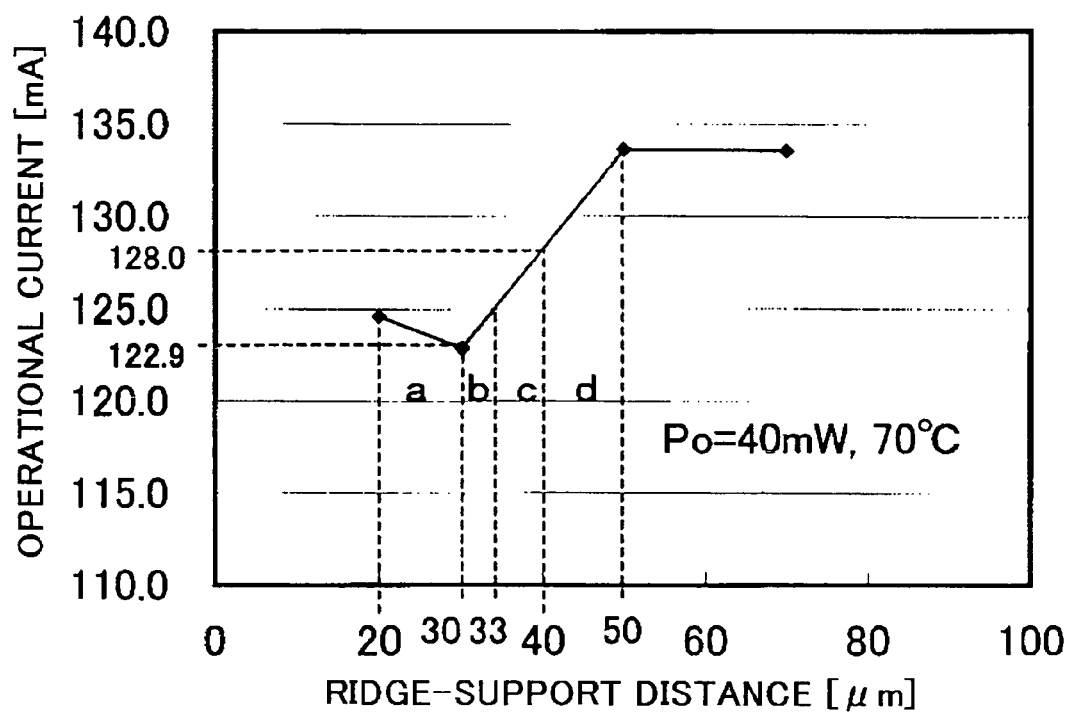
FIG. 5 is a graph showing the relationship between the ridge-support distance and operational current.

With the structure of the present embodiment, changes in an operational current $I_{op}$ to achieve a fixed optical output $P_0$ of 40 mW, for example, at an ambient temperature of 70 degrees Celsius relative to another operational current $I_{op}$ of about 85 mA to achieve another fixed optical output $P_0$ of 40 mW, for example, at an ambient temperature of 25 degrees Celsius were measured by changing the ridge-support distance Wa. Table 2 shows the measurement results. The chip width Wc means the width of one element and is 300 μm in the present embodiment. The width Ws of each of the supports 17, 17 is 50 μm. The width Wss is the total width of the supports 17, 17. FIG. 5 is a graph showing the relationship between the ridge-support distance Wa and the operational current $I_{op}$ based on the measurement shown in Table 2.

TABLE 2

| chip width Wc[um] | ridge-support distance Wa[um] | support width Ws[um] | ratio RW of total support width Wss relative to chip width Wc | operational current Iop[mA] |
| --- | --- | --- | --- | --- |
| 300 | 20 | 50 | 33% | 124.6 |
| 300 | 30 | 50 | 33% | 122.9 |
| 300 | 50 | 50 | 33% | 133.6 |
| 300 | 70 | 50 | 33% | 133.6 |

As shown in FIG. 5, with a ridge-support distance Wa of 70 μm as in related art, the operational current $I_{op}$ recorded the maximum value of 133.6 mA. With a ridge-support distance Wa ranging from 50 to 70 μm inclusive, the operational current $I_{op}$ also recorded the maximum value of 133.6 mA. This seems to be attributed to an increase in the operational current $I_{op}$ in line with a temperature rise in the active layer 13, since the heat generated in the active layer 13 does not easily transfer to the supports 17, 17 with the poor heat release performance as a result of the large ridge-support distance Wa.

Meanwhile, with a ridge-support distance Wa of 30 μm, the operational current $I_{op}$ recorded the minimum value of 122.9 mA, which seems to be attributed to enhanced heat release performance. In other words, with a ridge-support distance Wa of 30 μm, the highest heat release performance of the element seems to be available.

With a ridge-support distance Wa of 20 μm, the operational current $I_{op}$ was 124.6 mA, which was not the minimum value but was significantly lower than that with a ridge-support distance Wa of 70 μm as in related art, and thereby enhancing heat release effects. However, with a ridge-support distance Wa of 20 μm, the p-type cladding layer 21, the contact layer 22, and the contact layer 23 between the ridge 16 and the supports 17, 17 need to be accurately etched, resulting in difficulties in manufacturing. It is therefore necessary to make the ridge-support distance Wa larger than 20 μm. Also as shown in FIG. 5 graph, with a ridge-support distance Wa of 33 μm, the operational current $I_{op}$ was 124.6 mA same as above, which seems to provide high heat release effects.

Also as shown in FIG. 5 graph, with a ridge-support distance Wa of 40 μm, the operational current $I_{op}$ was around 128.0 mA, thereby providing the highest heat release effects next to a ridge-support distance Wa of 30 μm and 20 μm (33 μm).

Based on the above data, the upper limits of the ridge-support distance Wa can be less than 50 μm, 40 μm or less, 33 μm or less, or 30 μm or less to enhance the heat release performance of the element.

Likewise, the lower limits of the ridge-support distance Wa can be more than 20 μm, 30 μm or more, 33 μm or more, or 40 μm or more to facilitate etching between the ridge and supports.

Accordingly, an appropriate range of the ridge-support distance Wa is from more than 20 μm to less than 50 μm. Within this range, the above-mentioned upper and lower limits can be combined properly. In other words, the ridge-support distance Wa can range from more than 20 μm to less than 50 μm, from more than 20 μm to 40 μm or less, from more than 20 μm to 33 μm or less, or from more than 20 μm to 30 μm or less. Also, the ridge-support distance Wa can range from 30 μm or more to less than 50 μm, from 30 μm or more to 40 μm or less, or from 30 μm or more to 33 μm or less. Furthermore, the ridge-support distance Wa can range from 33 μm or more to less than 50 μm, from 33 μm or more to 40 μm or less, or from 40 μm or more to less than 50 μm.

As FIG. 5 shows, the ranges of the ridge-support distance Wa are set as follows here: the range a is from more than 20 μm to 30 μm or less; the range b is from 30 μm or more to 33 μm or less; the range c is from 33 μm or more to 40 μm or less; and the range d is from 40 μm or more to less than 50 μm. The limit values can be included in either the upper or lower range they define.

Supposing that the greatest attention is paid to a reduction in the operational current $I_{op}$, the ridge-support distance Wa set within at least one of the ranges a and b (i.e., a, b, or a+b) is the most preferable, the distance set within at least one of the ranges a, b, and c (e.g., a+b+c, b+c, or c) is the second most preferable, and the distance set within at least one of the ranges a, b, c, and d (e.g., a+b+c+d, b+c+d, or d) is the third most preferable.

With the above-described element including the supports 17, 17 on the sides of the ridge 16 located above the active layer 13, the above experimental results show that a ridge-support distance Wa ranging from more than 20 μm to less than 50 μm surely reduces the operational current $I_{op}$ to achieve a fixed optical output of 40 mW, for example, compared with a ridge-support distance Wa of 70 μm as in related art. In other words, by sufficiently reducing the ridge-support distance Wa from 70 μm as in related art, the heat generated in the active layer 13 is surely transferred to the submount through the ridge 16 and the supports 17, 17, thereby enhancing the heat release performance and temperature characteristics of the element. It is therefore possible to surely enhance the reliability of the element by setting the ridge-support distance Wa within the above range. Since the ridge-support distance Wa is set more than 20 μm, it is possible to surely prevent difficulties in manufacturing the element without adversely affecting etching between the ridge and supports.

When the lower limit of the ridge-support distance is set at 30 μm or more, a region to be etched between the ridge and supports increases, making it easier to etch the region.

The setting of the ratio of the width Wss of the supports 17, 17 relative to the chip width Wc of the element (hereinafter referred to as the "width ratio Rw") will now be described. Here, the width Ws indicates the width of each support 17. The width Wss indicates the total width of the supports 17, 17. In the element according to the present embodiment including the two supports 17, 17, the width Wss is twice as large as the width Ws. The width ratio is calculated by the formula:

(Support Width Wss/Chip Width Wc)×100.

With the structure of the present embodiment, changes in an operational current $I_{op}$ to achieve a fixed optical output $P_0$ of 40 mW, for example, at an ambient temperature of 70 degrees Celsius relative to another operational current $I_{op}$ of about 85 mA to achieve another fixed optical output $P_0$ of 40 mW, for example, at an ambient temperature of 25 degrees Celsius were measured by changing the width ratio Rw. Table 3 shows measurement results.

Figure 6:
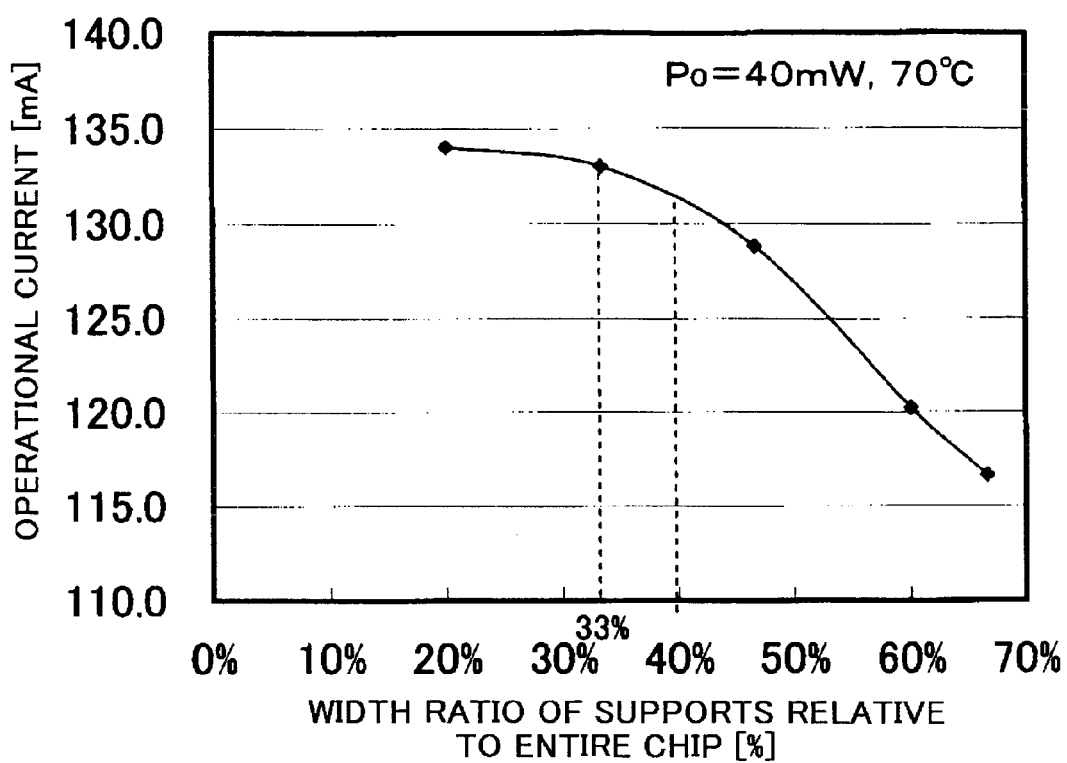
FIG. 6 is a graph showing the relationship between the ratio of the width of the supports relative to the entire width of the chip and operational current.
Figure 9:
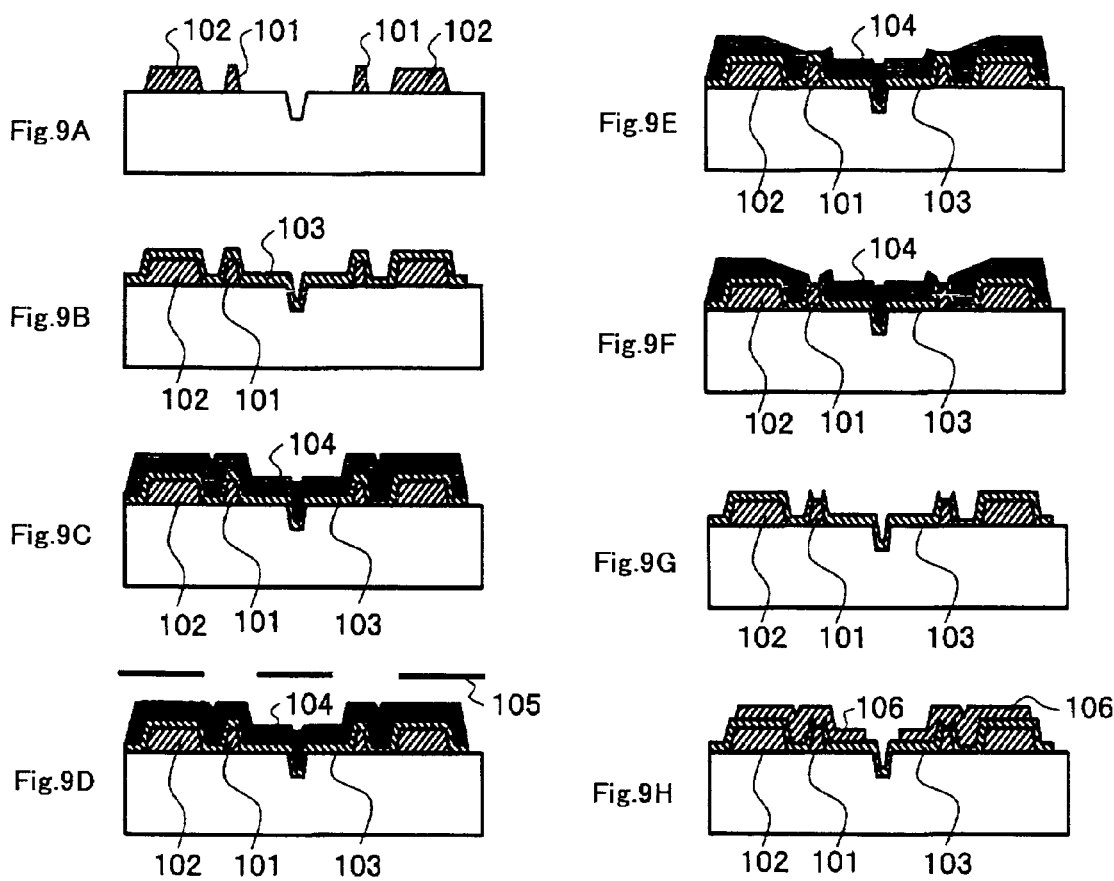
FIGS. 9A through 9H are sectional views showing manufacturing steps of a related art semiconductor laser element.

The chip width Wc was set at 300 μm here. The ridge-support distance Wa means the distance from the center of the ridge 16 to the ends of the supports 17, 17 on their sides facing the ridge 16. Here, the support width Ws and the width ratio Rw were changed while the total of the ridge-support distance Wa and the width Ws of the support 17 was fixed at 120 μm. FIG. 6 is a graph showing the relationship between the width ratio Rw and the operational current $I_{op}$ based on the measurement shown in Table 3.

TABLE 3

| chip width Wc[um] | ridge-support distance Wa[um] | each support width Ws[um] | ratio RW of total support width Wss relative to chip width Wc | operational current Iop[mA] |
| --- | --- | --- | --- | --- |
| 300 | 20 | 100 | 67% | 116.6 |
| 300 | 30 | 90 | 60% | 120.2 |
| 300 | 50 | 70 | 47% | 128.8 |
| 300 | 70 | 50 | 33% | 133.0 |
| 300 | 90 | 30 | 20% | 134.0 |

As shown in FIG. 6, with a width ratio Rw ranging from 20% to 33% inclusive thereof, the operational current $I_{op}$ reduced by only 1 mA. This means that the efficiency of the supports 17, 17 for releasing the heat generated in the active layer 13 was not sufficiently high, resulting in poor effects of preventing a temperature rise in the active layer 13 and thus of preventing a reduction in temperature characteristics.

Meanwhile, with a width ratio Rw exceeding 33%, the operational current $I_{op}$ reduced significantly. This means as the areas of the supports 17, 17 increased, heat release effects of the supports 17, 17 increased significantly, thereby effectively preventing a temperature rise in the active layer 13. It is therefore possible to surely prevent a temperature characteristics decrease of the element with a width ratio Rw exceeding 33%. In particular, with a width ratio Rw exceeding 40%, the operational current $I_{op}$ reduced more significantly, thereby providing higher effects of enhancing the temperature characteristics of the element.

To etch the ridge 16 and the supports 17, 17, it is necessary to secure a monitor region between the ridge 16 and the supports 17, 17 to visually monitor the progress of etching. With a width ratio Rw of 52% or more, the experimental results show that the progress of etching cannot be visually monitored by using this monitor region.

Although it is possible to raise the upper limit of the width ratio Rw by providing a monitor region on a wafer in advance, this method reduces the number of elements that can be isolated from the wafer by 10% compared with a wafer provided with no monitor region in advance, thereby lowering the efficiency of manufacturing the element.

The width ratio Rw preferably ranges from more than 33% to less than 52%, and more preferably from more than 40% to less than 52%. When the upper limit of the width ratio Rw is less than 50%, the etching monitor region can be enlarged. Accordingly, the width ratio Rw preferably ranges from more than 33% to less than 50%, and more preferably ranges from more than 40% to less than 50%.

With the above-described element including the supports 17, 17 on the sides of the ridge 16 located above the active layer 13, the above experimental results show that the ratio Rw of the support width Wss relative to the chip width Wc set within a range from more than 33% to less than 52% ensures a larger support area than in related art. Consequently, heat release effects of the supports 17, 17, that is, effects of releasing the heat generated in the active layer 13 to the outside (e.g., to the submount) can be surely enhanced. It is therefore possible to surely prevent a temperature rise in the active layer 13 and surely lower the operational current $I_{op}$ of the element, thereby surely enhancing element temperature characteristics and reliability. Since the ratio of the support width Wss accounts for less than 52% relative to the chip width Wc, it is possible to ensure the monitor region for etching of the ridge 16 and the supports 17, 17 and thus surely prevent difficulties in manufacturing the element.

Setting the width ratio Rw within the above-mentioned range can increase the area of the supports compared with that in related art, thereby surely enhancing the stability of mounting the element to the submount and making it easier to assemble the element by junction-down mounting.

With a fixed depth of the element, the ratio (hereinafter referred to as the "area ratio Rs") of the area of the supports relative to the entire area of the element (the plain area on the element surface when seen from above) is proportional to the width ratio Rw. Accordingly, the above-described ranges of the width ratio Rw can be put into the ranges of the area ratio Rs that can provide the same effects as described above.

In other words, an area ratio Rs ranging from more than 33% to less than 52%, the same effects as with a width ratio Rw ranging from more than 33% to less than 52% are available. In the same manner, an area ratio Rs ranging from more than 40% to less than 50%, the same effects as with a width ratio Rw ranging from more than 40% to less than 50% are available.

It is preferable that the support width (the total width of the first supports 17a and 37a and the second supports 17b and 37b) of the semiconductor laser element 1 provided with a plurality of ridges arranged in parallel with each other be as large as possible in terms of its heat release performance. However, the larger the support width is, the more difficult it is to visually monitor the progress of the etching of parts other than the supports. Considering both the heat release performance and etching monitoring, the width of the supports 17 and 37 is preferably set in a way that the width of parts other than the ridges 16 and 36 and the supports 17 and 37 accounts for 40% or more of the entire width of the element. Also, the area of the supports 17 and 37 is preferably set in a way that the area of parts other than the ridges 16 and 36 and the supports 17 and 37 accounts for 40% or more of the entire area of the element.

According to the present embodiment, the first support 17a and the second support 17b are symmetrical relative to ridge 16, and the first support 37a and the second support 37b are symmetrical relative to the ridge 36. However, this symmetry property is not an absolute requirement. The effects of the present embodiment thanks to the second supports 17b and 37b are available without the symmetrical property.

In other words, if the area ratio Rs is within the above-mentioned fixed ranges, the planar shape of the supports 17, 17 is not limited to stripes. FIGS. 7A through 7C show examples of the planar shape of the support 17 on one side. As FIG. 7A shows, the support 17 may be narrower at its parts corresponding to the ends of the ridge 16 in the longitudinal direction and wider at the other part. In contrast as FIG. 7B shows, the support 17 may be wider at its parts corresponding to the ends of the ridge 16 in the longitudinal direction and narrower at the other part. Alternatively, the support 17 may have an opening at the other part than its parts corresponding to the ends of the ridge 16 in the longitudinal direction as FIG. 7C shows.

The same can be said for the support 17 on the other side, and it may have any of the above-described planar shapes. Furthermore, the supports 17, 17 on one and the other sides may have different planar shapes from each other. It is also noted that the supports 17, 17 may have other planar shapes than those shown in FIGS. 7A through 7C.

The part of the support 17 other than its parts corresponding to the ends of the ridge 16 in the longitudinal direction means a portion overlapping the support 17 if a part of the ridge 16 other than its ends in the longitudinal direction is moved in parallel toward the support 17.

While the chip width Wc is set at 300 µm in the above description, the present invention is not limited to this. Appropriately setting the width ratio Rw or the area ratio Rs relative to a certain chip width Wc can provide the above-described effects.

According to the present embodiment, the isolation groove 5 provided to each outermost edge of the element 1 serves as a monitor region. Providing the second supports 17b and 37b on the inner sides of the ridges 16 and 36 in the element as mentioned above decreases a region for visual monitoring of the progress of etching of parts other than the supports, thereby increasing difficulties in the monitoring. Here, by providing the isolation groove 5 that can serve as a monitor region, it is possible to prevent element structural failures due to poor etching.

Since the isolation groove 5 separates adjacent elements and also serves as the monitor region as described above, no other monitor region than the isolation groove 5 is required by making use of the isolation groove 5.

According to the above-described embodiment, the ridge 16 and each support 17 are set to have a height of 10 µm or less (except for the p-type electrode), or preferably from 2 to 7 µm. The height from the active layer 13 to the top of the ridge 16 is set to be 10 µm or less, or preferably from 2 to 8 µm. The p-type electrode 19 is set to have a thickness of 1 to 5 µm. Accordingly, the height of the ridge 16 and each support 17 plus the p-type electrode 19 is set to be 15 µm or less, or preferably from 3 to 12 µm.

While the element emitting laser light of two different wavelengths is described in the present embodiment, the present invention is also applicable to an element emitting laser light of the same wavelength and an element emitting green, blue, or blue violet laser light as well as infrared and red laser light, for example, as long as the element has a plurality of ridges.

For example, an element 2 emitting blue violet laser light can be provided by depositing, on the GaN substrate 10, the n-type AlGaN cladding layer 12, the active layer 13 made of an InGaN well layer and a GaN barrier layer and having a three-dimensional periodic multiple quantum well (MQW) structure, the layer 14 made of InGaN and guiding light, the AlGaN etching stopper layer 15, a p-type AlGaN cladding layer 21, and a p-type GaN contact layer 22 in this order and processing the layers in the same manner as in the above-described steps.

INDUSTRIAL APPLICABILITY

The present invention is applicable, for example, to a semiconductor laser element used as a light source included in an information recorder and reproducer for recording and reproducing information with a recording medium, such as CD-R/RW, DVD-R/+RW, and high-density DVD, and a method for manufacturing thereof.

The invention claimed is:

1. A semiconductor laser element comprising:
   a plurality of ridges arranged in parallel with each other inside a pair of first supports protecting said ridges;
   a pair of second supports provided between said plurality of ridges and protecting said ridges wherein electrodes are formed on each ridges;
   a monitor region provided to an outermost edge of said semiconductor laser element to monitor progress of etching wherein said monitor region serves as an isolation groove to isolate said semiconductor laser element and
   wherein adjacent sidewalls of said pair of second supports extend directly downward into an underlying substrate forming an isolation groove between said adjacent sidewalls, and a ratio of an area of said first and second supports relative to a chip area of said semiconductor laser element is set within a range from more than 33% to less than 52%.

2. The semiconductor laser element according to claim 1, wherein each support of the pair of second supports is provided corresponding to each ridge.

3. The semiconductor laser element according to claim 1, wherein the ratio of the area of said first and second supports relative to the area of said semiconductor laser element is set within a range from more than 44% to less than 50%.

4. A method for manufacturing the semiconductor laser element according to claim 1 or 2, comprising:
   arranging a plurality of ridges in parallel with each other on an element surface and providing each ridge with a plurality of supports to sandwich each ridge;
   providing a block layer on surfaces of said ridges and said supports;
   applying a protective film by spin coating to a surface of said block layer;
   removing said protective film covering a top surface of said ridges;
   removing said block layer covering the top surface of said ridges with said protective film serving as a mask; and
   providing an electrode layer covering said ridges.

* * * * *